United States Patent
Deng et al.

(10) Patent No.: US 12,254,912 B2
(45) Date of Patent: Mar. 18, 2025

(54) SEMICONDUCTOR STRUCTURE, METHOD OF READING DATA FROM SEMICONDUCTOR STRUCTURE, AND METHOD OF WRITING DATA INTO SEMICONDUCTOR STRUCTURE

(71) Applicant: CHANGXIN MEMORY TECHNOLOGIES, INC., Hefei (CN)

(72) Inventors: Jiefang Deng, Hefei (CN); Wei Chang, Hefei (CN); Huihui Li, Hefei (CN); Xiang Liu, Hefei (CN); Jong Sung Jeon, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 214 days.

(21) Appl. No.: 18/161,152

(22) Filed: Jan. 30, 2023

(65) Prior Publication Data
US 2023/0410865 A1    Dec. 21, 2023

(30) Foreign Application Priority Data

Jun. 17, 2022 (CN) .......................... 202210689931.1

(51) Int. Cl.
*G11C 11/16* (2006.01)
(52) U.S. Cl.
CPC ........ *G11C 11/161* (2013.01); *G11C 11/1673* (2013.01); *G11C 11/1675* (2013.01)
(58) Field of Classification Search
CPC .............. G11C 11/161; G11C 11/1673; G11C 11/1675; G11C 19/0841; G11C 11/1659

USPC ........................................................ 365/158
See application file for complete search history.

(56) References Cited

U.S. PATENT DOCUMENTS

| | | | |
|---|---|---|---|
| 9,824,739 B2 * | 11/2017 | Yang ................... | G11C 19/0808 |
| 11,151,439 B2 | 10/2021 | Ouyang et al. | |
| 2010/0265616 A1 * | 10/2010 | Ohtake ................. | G11B 5/746 |
| | | | 360/110 |
| 2016/0125928 A1 | 5/2016 | Pileggi et al. | |
| 2019/0363244 A1 | 11/2019 | Sasaki et al. | |
| 2023/0335172 A1 * | 10/2023 | Hwang ................. | G11C 11/161 |

FOREIGN PATENT DOCUMENTS

CN           111293212 A    *    6/2020    ........... G11C 11/161

OTHER PUBLICATIONS

Liu (Year: 2020).*

(Continued)

*Primary Examiner* — Fernando Hidalgo
(74) *Attorney, Agent, or Firm* — Syncoda LLC; Feng Ma

(57) ABSTRACT

The present disclosure provides a semiconductor structure, a method of reading data from the semiconductor structure, and a method of writing data into the semiconductor structure. The semiconductor structure includes: a memory matrix, including a plurality of magnetic storage domains arranged in a staggered manner and including a first end, a second end, and an intermediate portion; and a reading and writing circuit, connected to the intermediate portion of the memory matrix and configured to write data into the magnetic storage domains and read data from the magnetic storage domains.

20 Claims, 13 Drawing Sheets

(56) References Cited

OTHER PUBLICATIONS

Zhao, W.S., et al., "Magnetic Domain-Wall Racetrack Memory for high density and fast data Storage", 2012 IEEE 11th International Conference on Solid-State and Integrated Circuit Technology, Feb. 21, 2013, p. 1-4.
Al Bahri, M., et al, "Staggered magnetic nanowire devices for effective domain-wall pinning in racetrack memory", Physical Review Applied, Feb. 8, 2019, pp. 1-7, No. 11, vol. 12.
Yang, Hongxin, et al., "Threshold Switching Selector and 1S1R Integration Development for 3D Cross-point STT-MRAM", 2017 IEEE International Electron Devices Meeting (IEDM), Jan. 25, 2018, pp. 38.1.1-38.1.4.

* cited by examiner

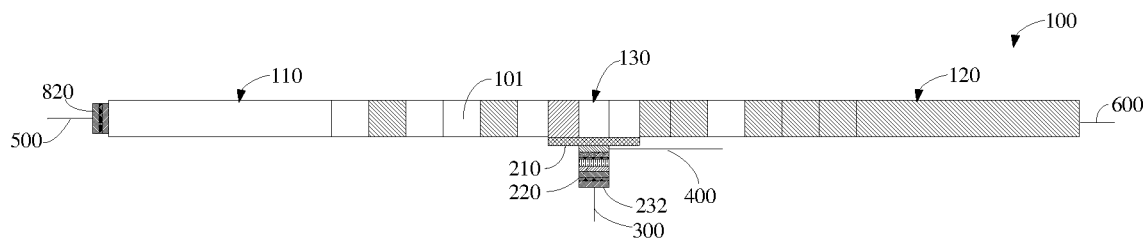

FIG. 17

```
┌─────────────────────────────────────────────┐
│ Input a second read signal into a second source line
│ and a second bit line in response to a data read       │ ── S110
│ command, to drive a magnetic storage domain at a       │
│ target position to move to a position corresponding to a│
│ reading and writing circuit                             │
└─────────────────────────────────────────────┘
                        │
┌─────────────────────────────────────────────┐
│ Input a first read signal into a first source line and a│
│ first bit line, to read data from the magnetic storage  │ ── S120
│ domain at the position corresponding to the reading    │
│ and writing circuit                                     │
└─────────────────────────────────────────────┘
```

FIG. 18

```
┌─────────────────────────────────────────────┐
│ Input a second write signal into a second source line  │
│ and a second bit line in response to a data write      │ ── S210
│ command, to drive a magnetic storage domain at a       │
│ target position to move to a position corresponding to a│
│ reading and writing circuit                             │
└─────────────────────────────────────────────┘
                        │
┌─────────────────────────────────────────────┐
│ Input a first write signal into a first source line and a│
│ first bit line, to write data into the magnetic storage │ ── S220
│ domain at the position corresponding to the reading    │
│ and writing circuit                                     │
└─────────────────────────────────────────────┘
```

FIG. 19

SEMICONDUCTOR STRUCTURE, METHOD OF READING DATA FROM SEMICONDUCTOR STRUCTURE, AND METHOD OF WRITING DATA INTO SEMICONDUCTOR STRUCTURE

CROSS-REFERENCE TO RELATED APPLICATIONS

This application claims the priority of Chinese Patent Application No. 202210689931.1, submitted to the China National Intellectual Property Administration on Jun. 17, 2022, the disclosure of which is incorporated herein in its entirety by reference.

TECHNICAL FIELD

The present disclosure relates to the technical field of semiconductors, and in particular, to a semiconductor structure, a method of reading data from the semiconductor structure, and a method of writing data into the semiconductor structure.

BACKGROUND

A magnetic random access memory (MRAM) is a new type of non-volatile random access memory based on the principle of tunnel magnetoresistance (TMR) of a magnetic tunnel junction, which has such advantages as fast read and write speed, low energy consumption, long life, and desired process compatibility.

However, the structure of the MRAM is usually complicated, which leads to a complicated fabrication process of the MRAM and high production cost.

SUMMARY

An overview of the subject described in detail in the present disclosure is provided below. This overview is not intended to limit the protection scope of the claims.

The present disclosure provides a semiconductor structure, a method of reading data from the semiconductor structure, and a method of writing data into the semiconductor structure.

A first aspect of the present disclosure provides a semiconductor structure. The semiconductor structure includes:
  a memory matrix, including a plurality of magnetic storage domains arranged in a staggered manner and including a first end, a second end, and an intermediate portion; and
  a reading and writing circuit, connected to the intermediate portion of the memory matrix and configured to write data into the magnetic storage domains and read data from the magnetic storage domains.

A second aspect of the present disclosure provides a method of reading data from the semiconductor structure. The method includes:
  inputting a second read signal into a second source line and a second bit line in response to a data read command, to drive a magnetic storage domain at a target position to move to a position corresponding to a reading and writing circuit; and
  inputting a first read signal into a first source line and a first bit line, to read the data from the magnetic storage domain at the position corresponding to the reading and writing circuit.

A third aspect of the present disclosure provides a method of writing data into the semiconductor structure. The method includes:
  inputting a second write signal into a second source line and a second bit line in response to a data write command, to drive a magnetic storage domain at a target position to move to a position corresponding to a reading and writing circuit; and
  inputting a first write signal into a first source line and a first bit line, to write the data into the magnetic storage domain at the position corresponding to the reading and writing circuit.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

FIG. 17 is a schematic structural diagram of a semiconductor structure according to one exemplary embodiment.

FIG. 18 is a flowchart of a method of reading data from the semiconductor structure according to one exemplary embodiment.

FIG. 19 is a flowchart of a method of writing data into the semiconductor structure according to one exemplary embodiment.

REFERENCE NUMERALS

Figure 1:
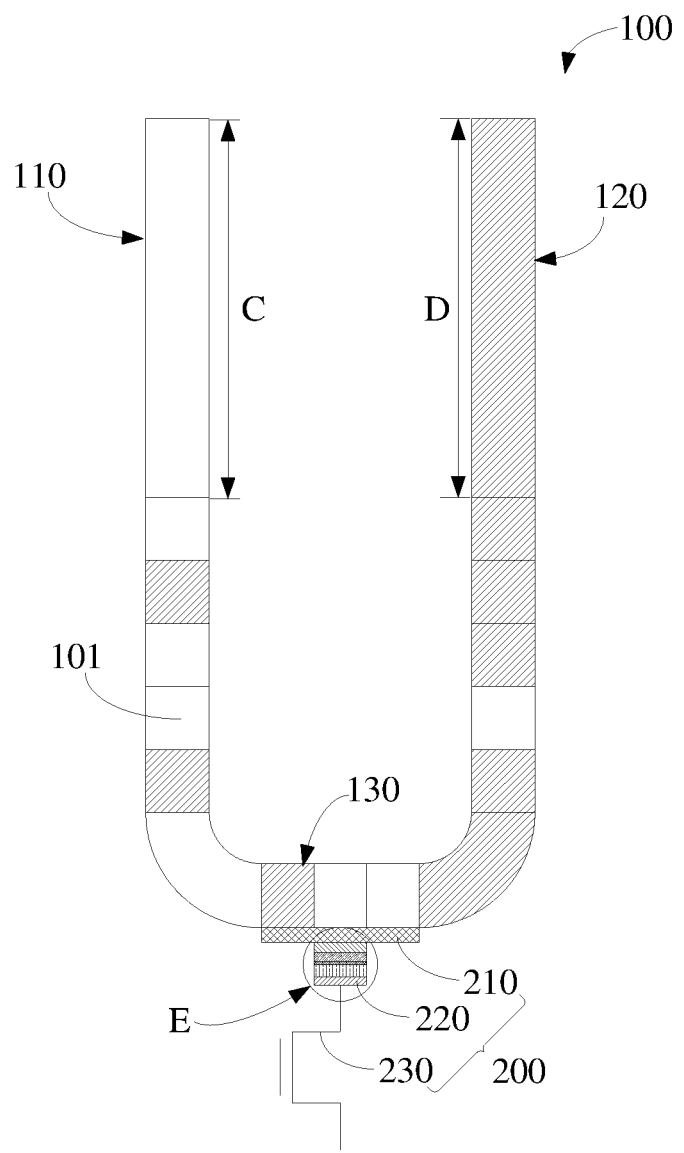
FIG. 1 is a schematic structural diagram of a semiconductor structure according to one exemplary embodiment.

100. Memory matrix; 101. Magnetic storage domain; 101a. First butting surface; 101b. Second butting surface; 110. First end; 120. Second end; 130. Intermediate portion; 200. Reading and writing circuit; 210. Isolation layer; 220. Magnetic tunnel junction; 221. First electrode; 222. Free layer; 223. Tunneling barrier layer; 224. Reference layer; 225. Second electrode; 230. First control circuit; 231. First transistor; 232. First HfO film selector; 240. HfO film selector; 241. Electrode; 242. Switch material layer; 300. First source line; 400. First bit line; 500. Second source line; 600. Second bit line; 700. Word line; 810. Second transistor; 820. Second HfO film selector.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

To implement data writing and reading for the magnetic storage domains in the MRAM, it is usually necessary to provide a read device and a write device in the MRAM. The read device reads data from the magnetic storage domains, and the write device writes the data into the magnetic storage domains. In addition, the read device and the write device need to be separately provided with a set of signal lines. That is, the read device is correspondingly provided with a read signal line, and is controlled to read the data stored in the magnetic storage domains through the read signal line; and the write device is correspondingly provided with a write signal line, and is controlled to write the data into the magnetic storage domains through the write signal line.

In the structure of the MRAM, a set of devices and a set of signal lines are configured to read and write the data to meet read and write requirements, such that the structure and fabrication process are complicated, resulting in high costs.

On this basis, an exemplary embodiment of the present disclosure provides the semiconductor structure, in which the memory matrix and the reading and writing circuit are provided. The memory matrix includes the plurality of magnetic storage domains arranged in a staggered manner, the magnetic storage domains can store the data, and the staggered arrangement of the magnetic storage domains can ensure the stability of the data stored in the magnetic storage domains. The reading and writing circuit is connected to the intermediate portion of the memory matrix, and can not only write data into the magnetic storage domains but also read data from the magnetic storage domains, such that the structure of the semiconductor structure is simpler and more compact, and costs are reduced.

Figure 3:
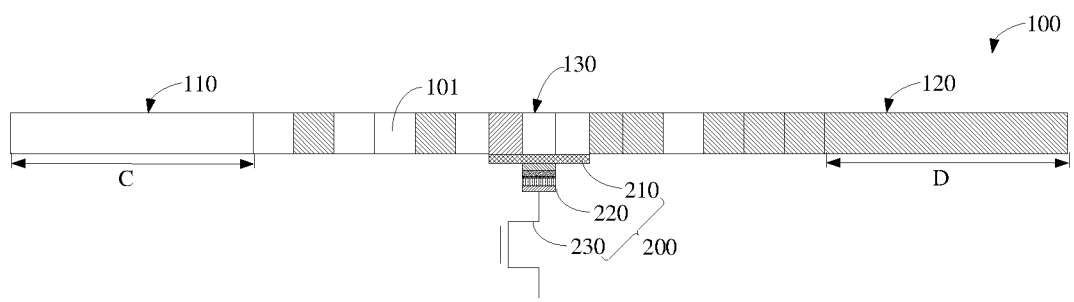
FIG. 3 is a schematic structural diagram of a semiconductor structure according to one exemplary embodiment.

As shown in FIG. 1 and FIG. 3, an exemplary embodiment of the present disclosure provides the semiconductor structure, and this embodiment does not limit the semiconductor structure. That the semiconductor structure is a dynamic random access memory (DRAM) is used as an example below for description, but this embodiment is not limited thereto. Alternatively, the semiconductor structure in this embodiment may be other structures.

As shown in FIG. 1 and FIG. 3, the semiconductor structure includes a memory matrix 100 configured to store multi-bit data, and a reading and writing circuit 200 configured to read and write the data in the memory matrix 100. It can be understood that the reading and writing circuit 200 described herein refers to a device having both a data read function and a data write function.

Still referring to FIG. 1 and FIG. 3, the memory matrix 100 includes a plurality of magnetic storage domains 101 arranged in a staggered manner, and each magnetic storage domain 101 is configured to store one-bit data. For example, the magnetic storage domains 101 represent the stored data through its magnetization vector directions. For example, a first magnetization vector direction of the magnetic storage domains 101 is employed to indicate that the stored data is "0", and a second magnetization vector direction of the magnetic storage domains 101, which is opposite to the first magnetization vector direction, is employed to indicate that the number stored therein is "1". The magnetization vector directions of the magnetic storage domains 101 can be changed under the action of an external magnetic field or current, thereby writing the data.

Figure 4:
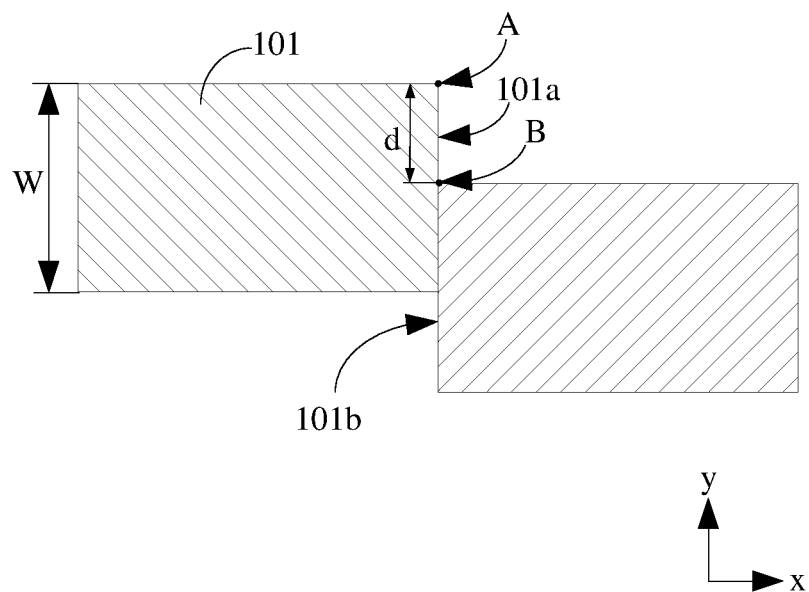
FIG. 4 is a schematic structural diagram of adjacent magnetic storage domains in a semiconductor structure according to one exemplary embodiment.
Figure 5:
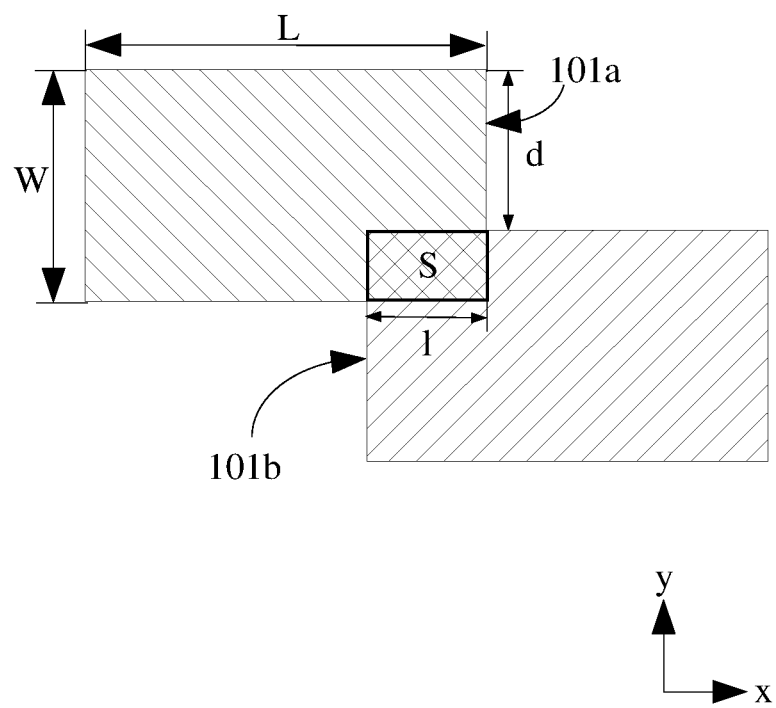
FIG. 5 is a schematic structural diagram of adjacent magnetic storage domains in a semiconductor structure according to one exemplary embodiment.

The staggered arrangement herein refers to that the butting surfaces of the adjacent magnetic storage domains 101 are not completely overlapped, but are arranged in a staggered manner. For example, as shown in FIG. 4, the magnetic storage domains 101 are block-shaped. In adjacent ones of the magnetic storage domains 101, a first butting surface 101a of one magnetic storage domain 101 is opposite to a second butting surface 101b of the other magnetic storage domain 101. In some embodiments, as shown in FIG. 4, the first butting surface 101a and the second butting surface 101b may be staggered along a y direction, a size of the first butting surface 101a and a size of the second butting surface 101b in the y direction are both W, a distance between a side edge of the first butting surface 101a in the y direction (such as a position where a point A is located shown in FIG. 4) and a corresponding side edge of the second butting surface 101b in the y direction (such as a position where a point B is located shown in FIG. 4) is d, and a size of an overlapping region of the two magnetic storage domains 101 in the y direction is W-d. In some other embodiments, as shown in FIG. 5, the adjacent magnetic storage domains 101 are staggered in both x direction and y direction. That is, the first butting surface 101a of one magnetic storage domain 101 and the second butting surface 101b of the other magnetic storage domain 101 are staggered along both the x direction and the y direction, then the size of the overlapping region of the two magnetic storage domains 101 is 1 in the x direction and is W-d in the y direction.

The relative positions of the magnetic storage domains 101 in the memory matrix 100 can move within the memory matrix 100 under the action of a drive current. For example, the memory matrix 100 is a 1*N matrix. That is, the memory matrix 100 includes one row and N columns of magnetic storage domains 101, and the magnetic storage domains 101 can move to adjacent positions. The staggered arrangement of the plurality of magnetic storage domains 101 can effectively ensure the data independence between the adjacent magnetic storage domains 101, and effectively guarantee the stability of the data stored in the magnetic storage domains 101, i.e., effectively ensuring the stability of the magnetization vector directions of the magnetic storage domains 101.

The memory matrix 100 includes a first end 110, a second end 120, and an intermediate portion 130. The first end 110 and the second end 120 each include a plurality of magnetic storage domains 101. The reading and writing circuit 200 is connected to the intermediate portion 130 of the memory matrix 100. The reading and writing circuit 200 can write the data into the magnetic storage domains 101 and read data from the magnetic storage domains 101. For example, the magnetic storage domains 101 located at the first end 110 and the second end 120 can be transmitted to the intermediate portion 130 under the driving of the drive current, and the reading and writing circuit 200 performs a data read or write operation on the magnetic storage domains 101 transmitted to the intermediate portion 130.

In this embodiment, the reading and writing circuit 200 in the semiconductor structure can not only write data into the magnetic storage domains 101 but also read data from the magnetic storage domains 101, such that the structure of the semiconductor structure is simpler and more compact, and costs are reduced.

As described above, the adjacent magnetic storage domains 101 are arranged in a staggered manner, such that an overlapping region may be formed between the adjacent magnetic storage domains 101. For example, in the embodiment shown in FIG. 5, the overlapping region S is formed between the adjacent magnetic storage domains 101. A maximum size of the overlapping region S is 35% to 70% of a width of the magnetic storage domain 101. For example, the maximum size of the overlapping region S is 35%, 50%, 65%, 70%, or the like of the width of the magnetic storage domain 101. In this way, the structural reliability of the memory matrix 100 can be ensured, and the data independence between the adjacent magnetic storage domains 101 can be ensured, thereby ensuring the stability of the data stored in the magnetic storage domains 101.

It can be understood that, the maximum size of the overlapping region S herein refers to the longest distance between any two points in the outer contour of the overlapping region S. For example, taking FIG. 5 as an example, the overlapping region S is a rectangular frame, and the maximum size of the overlapping region S is the diagonal length of the rectangular frame. The width of the magnetic storage domain 101 refers to the length of the smaller side of the magnetic storage domain 101. For example, as shown in FIG. 5, the two edges of the magnetic storage domain 101 are an edge L and an edge W, respectively, where the edge L is greater than the edge W, and the edge W is the width of the magnetic storage domain 101. If the edge L is smaller than the edge W, the edge L is the width of the magnetic storage domain 101.

In some embodiments, the memory matrix 100 is of a strip-shaped structure extending along one direction. That is, the magnetic storage domains 101 in the first end 110, the intermediate portion 130, and the second end 120 are all arranged along the extension direction, and each magnetic storage domain 101 can move to the adjacent positions in the extension direction under the action of the drive current. In this embodiment, a plurality of memory matrices 100 may be arranged side by side and in parallel on a substrate to form a magnetic memory, and the memory matrix 100 in this structural form may be referred to as a horizontal memory matrix. In some other embodiments, the first end 110 and the second end 120 are both perpendicular to the intermediate portion 130, such that the structure of the memory matrix 100 is more compact. In this embodiment, a plurality of memory matrices 100 may be arranged on a substrate in an array to form a magnetic memory; the first end 110 and the second end 120 are both perpendicular to the substrate; and the memory matrix 100 in this structural form may be referred to as a vertical memory matrix. The vertical memory matrix is, as a whole, perpendicular to the substrate, such that the structure of the magnetic memory is more compact, and the occupied space is smaller.

Still referring to FIG. 1 and FIG. 3, the first end 110 includes a plurality of consecutive magnetic storage domains 101 of a first direction (such as a region C in the figures), the second end 120 includes a plurality of consecutive magnetic storage domains 101 of a second direction (such as a region D in the figures), and the first direction is different from the second direction. For example, the direction of the plurality of consecutive magnetic storage domains 101 of the first end 110 is the first magnetization vector direction, the direction of the plurality of consecutive magnetic storage domains 101 of the second end 120 is the second magnetization vector direction, and a plurality of consecutive magnetic storage domains 101 having the same magnetization vector direction are separately provided at both ends of the memory matrix 100, such that it can be ensured that the data stored in the magnetic storage domains 101 between the first end 110 and the second end 120 is not lost. That is, the first end 110 and the second end 120 can provide an enough moving space for the data in the plurality of magnetic storage domains 101 between the first end 110 and the second end 120, such that it can be ensured that the data in the magnetic storage domains 101 between the first end 110 and the second end 120 can all move to the intermediate portion 130 for reading and writing, and the data is not lost in the moving process.

The magnetic storage domains 101 in the memory matrix 100 are staggered oppositely. That is, the magnetic storage domains 101 at both ends of one magnetic storage domain 101 are staggered oppositely with respect to the magnetic storage domain 101 in the middle. For example, the magnetic storage domain 101 located at one end of the magnetic storage domain 101 in the middle is staggered upwards, and the magnetic storage domain 101 located at the other end of the magnetic storage domain 101 in the middle is staggered downwards.

Figure 6:
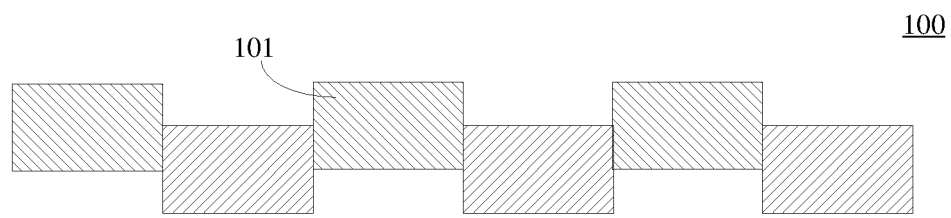
FIG. 6 is a schematic structural diagram of a semiconductor structure according to one exemplary embodiment.
Figure 7:
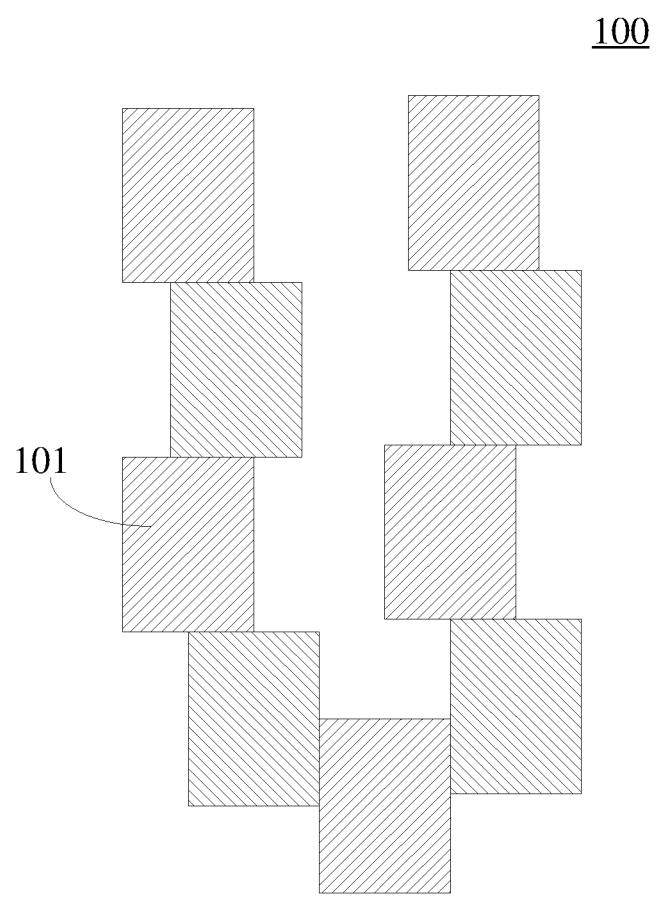
FIG. 7 is a schematic structural diagram of a semiconductor structure according to one exemplary embodiment.

In some other embodiments, as shown in FIG. 6 and FIG. 7, the adjacent magnetic storage domains 101 are staggered oppositely. That is, the magnetic storage domains 101 at both ends of one magnetic storage domain 101 are staggered in the same direction with respect to the magnetic storage domain 101 in the middle. For example, in the horizontal memory matrix shown in FIG. 6, the magnetic storage domains 101 located at both ends of the magnetic storage domain 101 in the middle are staggered upwards or downwards. For another example, in the vertical memory matrix shown in FIG. 7, in the magnetic storage domains 101 of the first end 110 and the second end 120, the magnetic storage domains 101 located at both ends of the magnetic storage domain 101 in the middle are staggered leftwards or rightwards. In this way, when the storage stability of the data in the magnetic storage domains 101 is ensured, the structure of the memory matrix 100 can be more compact, thereby further reducing the occupied space of the memory matrix 100.

As shown in FIG. 1 and FIG. 3, the reading and writing circuit 200 includes an isolation layer 210, a magnetic tunnel junction (MTJ) 220, and a first control circuit 230, where the isolation layer 210 is arranged between the magnetic tunnel junction 220 and the intermediate portion 130 of the memory matrix 100. The first control circuit 230 is configured to control on/off of a signal, such as a read signal or a write signal, inputted into the magnetic tunnel junction 220. The first control circuit 230 may be, for example, a control device such as a transistor.

In some embodiments, the transistor includes a gate, a source, and a drain. The source of the transistor may be connected to a read and write signal line, the drain of the transistor may be connected to the magnetic tunnel junction 220, and the gate of the transistor is employed to control connection/disconnection of the source and the source of the transistor, to control the connection/disconnection of the read and write signal line and the magnetic tunnel junction 220.

Figure 8:
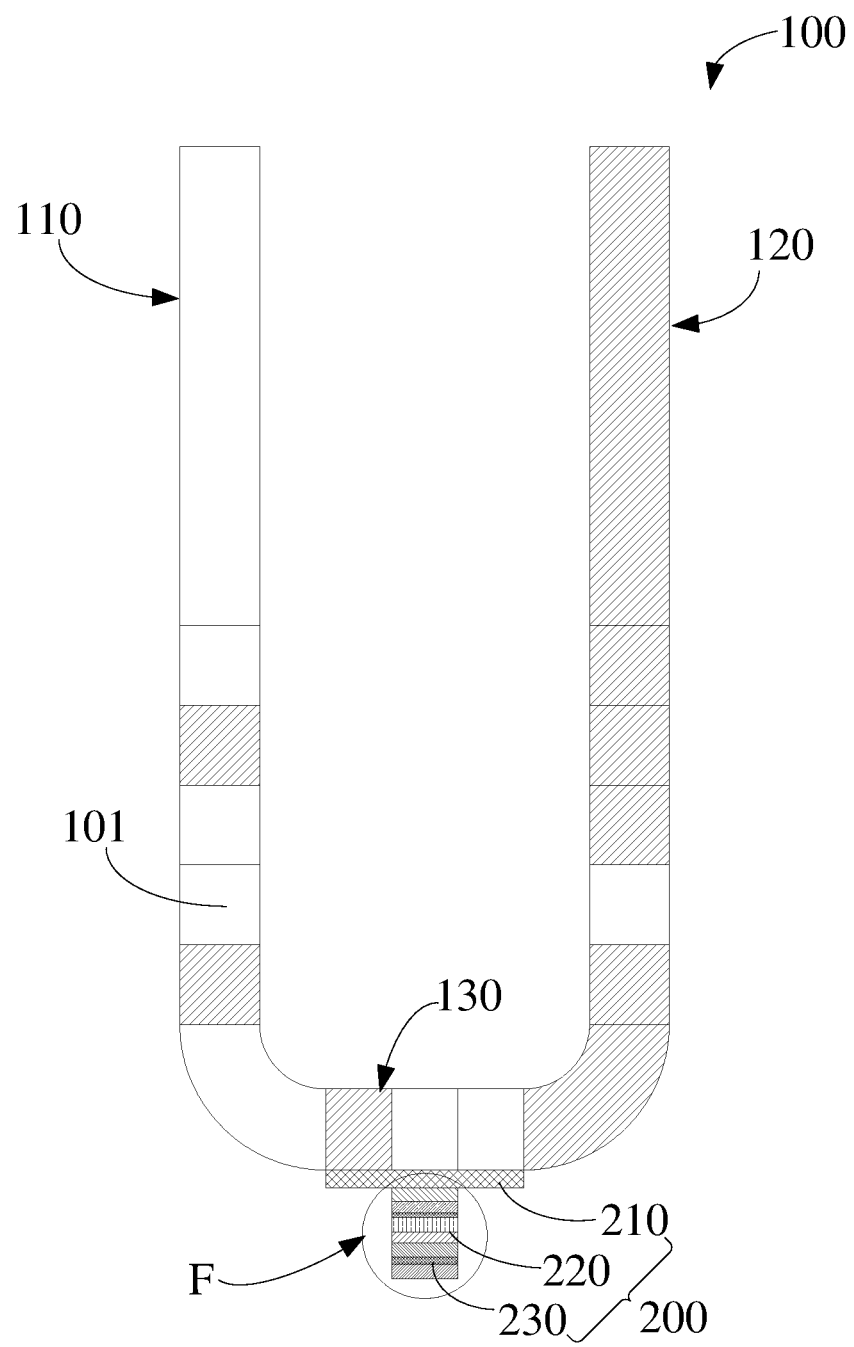
FIG. 8 is a schematic structural diagram of a semiconductor structure according to one exemplary embodiment.
Figure 9:
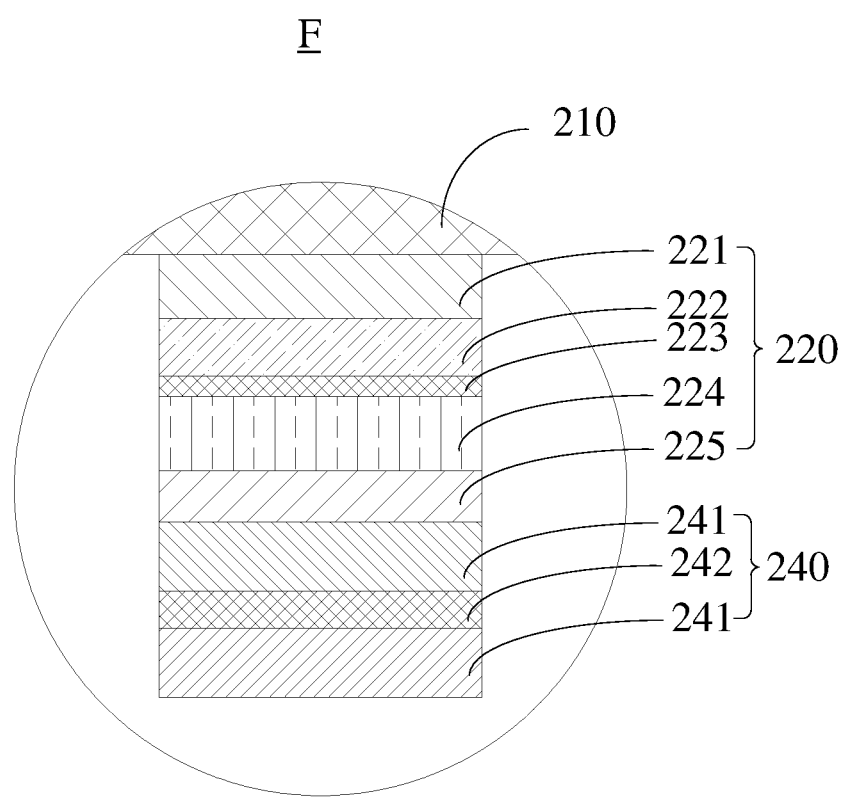
FIG. 9 is an enlarged view of a position F in FIG. 8.

In some other embodiments, as shown in FIG. 8 and FIG. 9, the HfO film selector 240 includes two electrodes 241 and a switch material layer 242 provided between the two electrodes 241. The connection/disconnection between the two electrodes 241 may be controlled by changing a voltage loaded between the two electrodes 241. The switch material layer 242 may be, for example, a transition metal oxide. As an example, the material of the switch material layer 242 may be $VO_2$, $NbO_2$, $Ta_2O_5$, $Ti_3O_5$, $Ti_2O_3$, and some mixed oxides, such as $LaCoO_3$ and $SmNiO_3$. One electrode 241 of the HfO film selector 240 may be connected to the read and write signal line, and the other electrode 241 is connected to the magnetic tunnel junction 220. The on/off of the HfO film selector 240 may be controlled by controlling the voltage between the two electrodes 241, to control the connection/disconnection between the read and write signal line and the magnetic tunnel junction 220.

Figure 2:
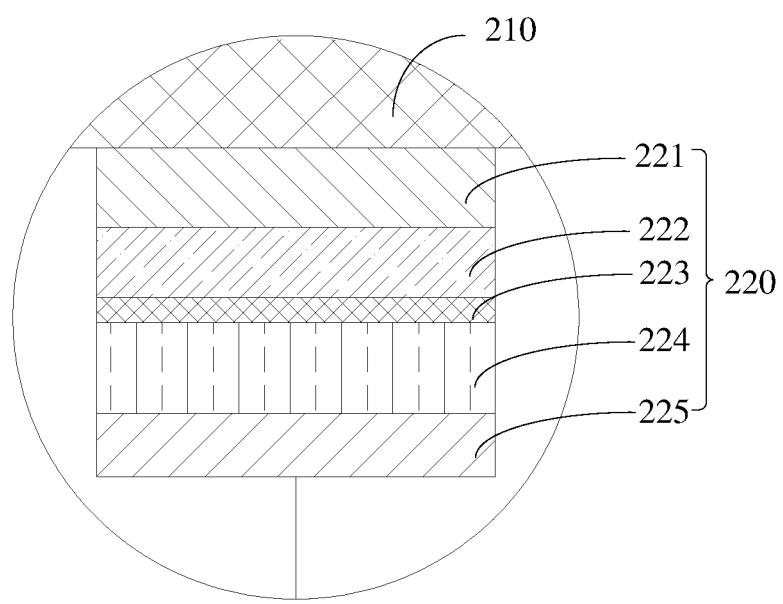
FIG. 2 is an enlarged view of a position E in FIG. 1.

As shown in FIG. 2, the magnetic tunnel junction 220 includes a first electrode 221, a free layer (FL) 222, a tunneling barrier layer (TBL) 223, a reference layer (RL) 224, and a second electrode 225 arranged in a stacked manner. The magnetism of the reference layer 224 remains unchanged, and the magnetization vector direction of the free layer 222 is changed with a write current. For example, the material of the reference layer 224 is one or a combination of more of cobalt iron boron, iron boron, cobalt iron carbon, iron, and iron cobalt; and the thickness of the reference layer 224 is 0.7 nm to 1.3 nm. The material of the tunneling barrier layer 223 is magnesium oxide; and the thickness of the tunneling barrier layer 223 is 0.8 nm to 2.0 nm. The material of the free layer 222 is one or a combination of more of cobalt iron boron, tungsten, molybdenum, magnesium oxide, iron, iron boron, cobalt boron, ruthenium, and tantalum. Furthermore, the free layer 222 is generally of a four-layer structure formed by a cobalt iron boron layer, a tungsten or molybdenum layer, a cobalt iron boron layer, and a magnesium oxide layer; and the thickness of the free layer 222 is 1.5 nm to 2.5 nm. The first electrode 221 and the second electrode 225 are configured to connect the magnetic tunnel junction 220 and other structures; the materials of the first electrode 221 and the second electrode 225 may be, for example, one or a combination of more of titanium, titanium nitride, tungsten, nitride, tantalum, and tantalum nitride; and the thicknesses of the first electrode 221 and the second electrode 225 are 10 nm to 100 nm.

For example, when a non-polar current (that is, electrons in the current include half up-spin electrons and half down-spin electrons) passes through the reference layer 224 first and then passes through the free layer 222, the spin direction of electrons in the non-polar current may first be transformed to be the same as a magnetic moment direction of a fixed magnetic moment of the reference layer 224, such that after these electrons pass through the tunneling barrier layer 223 to the free layer 222, the spin direction of the electrons in the free layer 222 may also be forcibly transformed to be same as the magnetic moment direction of the fixed magnetic moment of the reference layer 224 due to the influence of the spin direction of these electrons, to form a spin-polarized current (i.e., a current formed by a larger proportion of up-spin electrons or down-spin electrons) having the same polarization direction as the magnetic moment direction of the fixed magnetic moment of the reference layer 224.

When the non-polar current passes through the free layer 222 first and then passes through the reference layer 224, most of the electrons in the non-polar current pass through the free layer 222 quickly first and then pass through the tunneling barrier layer 223 to the reference layer 224. When these electrons encounter the reference layer 224, the reference layer 224 may bounce the electrons of which the spin direction is opposite to the magnetic moment direction of the fixed magnetic moment of the reference layer 224, such that the spin direction of the electrons in the free layer 222 may be affected by the spin direction of these electrons, and the electrons are transformed to be opposite to the magnetic moment direction of the fixed magnetic moment of the reference layer 224, to form a spin-polarized current having a polarization direction opposite to the magnetic moment direction of the fixed magnetic moment of the reference layer 224. If the spin-polarized current includes more electrons having a first spin direction, the polarization direction thereof is the first spin direction, such as the above first magnetization vector direction. If the spin-polarized current includes more electrons having a second spin direction, the polarization direction thereof is the second spin direction, such as the above second magnetization vector direction.

In other embodiments, a pinning layer (not shown in the figures) may also be provided between the reference layer 224 and the second electrode 225. Through the spinning layer, the reference layer 224 is kept in a stable magnetization vector direction. For example, the spinning layer includes a seed layer, a synthetic anti-ferromagnetic (SyAF) layer, and a ferromagnetic coupling layer arranged in a stacked manner. The seed layer is configured to grow the synthetic anti-ferromagnetic layer having good lattice orientation; and the material of the seed layer may be, for example, one or a combination of more of platinum, palladium, nichrome, ruthenium, and cobalt iron boron. The synthetic anti-ferromagnetic layer is configured to effectively pin the reference layer; the material of the synthetic anti-ferromagnetic layer may be, for example, Co[Pt/Co]n/Ru/Co[Pt/Co]m, where $0 \leq m \leq 3$, and $2 \leq n \leq 7$; and the thickness of each layer of cobalt (Co) or palladium (Pt) may be the same or different. The ferromagnetic coupling layer is configured to ferromagnetic coupling of the synthetic anti-ferromagnetic layer and the reference layer; and the material of the ferromagnetic coupling layer may be, for example, one or a combination of more of tungsten, tantalum, and molybdenum.

In addition, the reading and writing circuit 200 is coupled to the corresponding magnetic storage domain 101 through the isolation layer 210, such that the data write and read operation can be performed on the magnetic storage domain 101.

Still referring to FIG. 2, the first electrode 221 is connected to the isolation layer 210, such that the data writing and reading is performed on the magnetic storage domain 101 through the magnetic tunnel junction 220 under the control action of the first control circuit 230. For example, a write current is injected into the magnetic tunnel junction 220. If the polarization direction of the spin-polarized current formed after the write current flows through the magnetic tunnel junction 220 is the same as the magnetic moment direction of the fixed magnetic moment of the reference layer 224, the magnetic tunnel junction 220 is coupled through the isolation layer 210 such that the magnetization vector direction of the magnetic storage domain 101 corresponding to the position of the magnetic tunnel junction 220 is the first magnetization vector direction, thereby writing the data "0" into the magnetic storage domain 101. If the polarization direction of the spin-polarized current formed after the write current flows through the magnetic tunnel junction 220 is opposite to the magnetic moment direction of the fixed magnetic moment of the reference layer 224, the magnetic tunnel junction 220 passes through the isolation layer 210 such that the magnetization vector direction of the magnetic storage domain 101 corresponding to the position of the magnetic tunnel junction 220 is the second magnetization vector direction, thereby writing the data "1" into the magnetic storage domain 101.

The isolation layer 210 may be connected to one magnetic storage domain 101 of the intermediate portion 130, such that the magnetic tunnel junction 220 can perform the data reading and writing on one magnetic storage domain 101 connected thereto through the isolation layer 210. In some other embodiments, as shown in FIG. 2, the isolation layer 210 is connected to a plurality of magnetic storage domains 101, for example, connected to at least three of the magnetic storage domains 101, such that the magnetic tunnel junction 220 can perform the data reading on the magnetic storage domain 101 connected thereto through the isolation layer 210.

Figure 10:
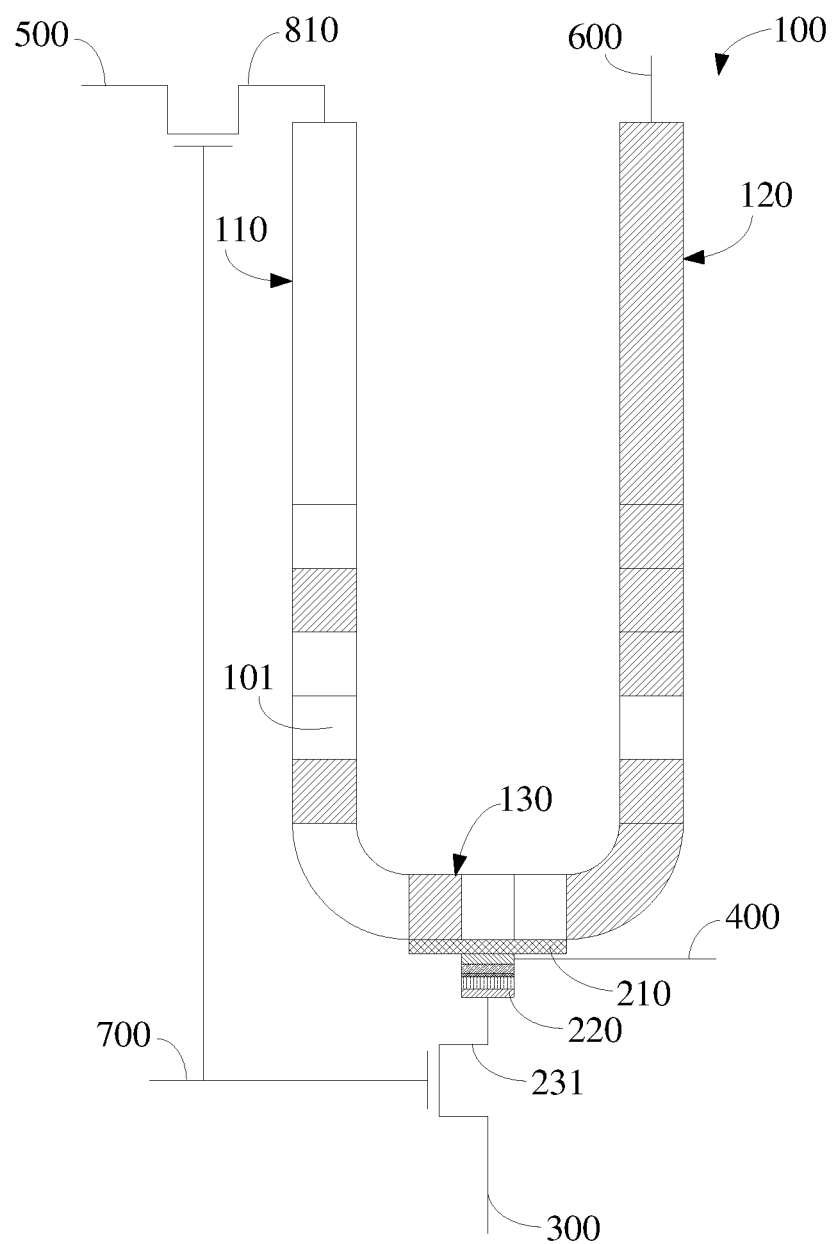
FIG. 10 is a schematic structural diagram of a semiconductor structure according to one exemplary embodiment.

An exemplary embodiment of the present disclosure provides a semiconductor structure. The semiconductor structure includes a memory matrix 100 and a reading and writing circuit 200. As shown in FIG. 10, the semiconductor structure further includes a first source line 300, a first bit line 400, and a drive device. The first source line 300 and the first bit line 400 are both connected to the reading and writing circuit 200, and are configured to control the reading and writing circuit 200 to perform the data read and write operation on the magnetic storage domain 101. The drive device is configured to move the data in the magnetic storage domain 101 that wants to read or write data to a position corresponding to the reading and writing circuit 200. For example, the drive device includes a second source line 500 provided at the first end 110 and a second bit line 600 provided at the second end 120. By controlling the voltage between the second source line 500 and the second bit line 600, the magnetic storage domain 101 at a target position (i.e., the magnetic storage domain 101 that wants to read or write data) can be driven to move to a position corresponding to the reading and writing circuit 200, such that the reading and writing circuit 200 performs the data reading and writing on the corresponding magnetic storage domain 101.

For example, the first source line 300 is connected to the second electrode 225 of the reading and writing circuit 200, and the first bit line 400 is connected to the first electrode 221 of the reading and writing circuit 200. By inputting different write signals into the first source line 300 and the first bit line 400, spin-polarized currents having different polarization directions are generated in the magnetic tunnel junction 220, and the writing of different data into the magnetic storage domain 101 is implemented by using the spin-polarized currents having different polarization directions. For example, the polarization vector direction of the magnetic storage domain 101 is the first polarization vector direction, thereby writing the data "0" into the magnetic storage domain 101. For another example, the polarization vector direction of the magnetic storage domain 101 is the second polarization vector direction, thereby writing the data "1" into the magnetic storage domain 101. In addition, since the magnetization vector directions of the magnetic storage domains 101 are different, corresponding detection results are also different, for example, the magnitude of the detected current may be affected. By determining the magnitude of the current, the magnetization vector directions of the magnetic storage domains 101 may be determined, and then the data stored in the magnetic storage domains 101 may be determined. In this way, a read signal may be inputted into the first source line 300 and the first bit line 400, thereby detecting to obtain the data stored in the magnetic storage domains 101. The read signal is less than the write signal, to ensure that the read signal cannot affect the data stored in the magnetic storage domains 101.

In one embodiment, a second control circuit (not shown in the figures) is also provided between the first end 110 of the memory matrix 100 and the second source line 500, and the second control circuit is configured to control the on/off of a drive signal (for driving the movement of the magnetic tunnel junction 220) inputted into the memory matrix 100. The second control circuit may be, for example, a control device such as a transistor.

As described above, the first control circuit 230 may also be a transistor. When the first control circuit 230 and the second control circuit each include the transistor, the semiconductor structure further includes a word line 700. The word line 700 is connected to a gate of the transistor, such that the word line 700 controls the on/off of the transistor.

Figure 11:
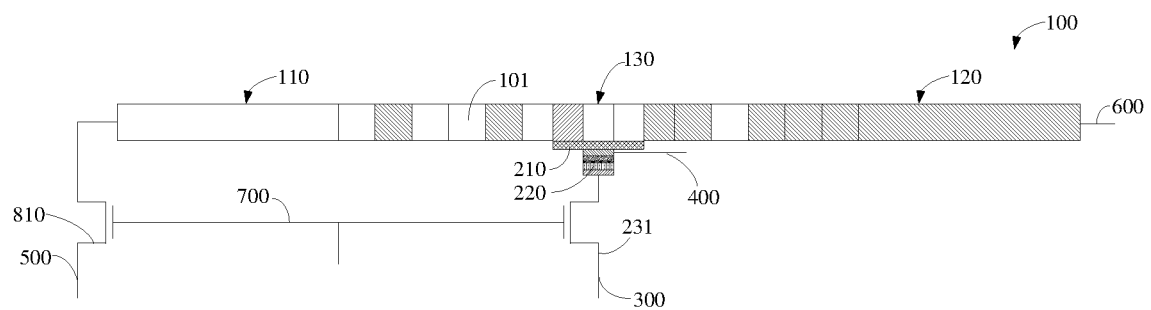
FIG. 11 is a schematic structural diagram of a semiconductor structure according to one exemplary embodiment.

For example, as shown in FIG. 10 and FIG. 11, the first control circuit 230 includes a first transistor 231 provided with a source connected to the first source line 300 and a drain connected to the second electrode 225 of the magnetic tunnel junction 220. The second control circuit includes a second transistor 810 provided with a source connected to the second source line 500 and a drain connected to the first end 110. A gate of the first transistor 231 and a gate of the second transistor 810 are both connected to the word line 700, and the first transistor 231 and the second transistor 810 share the word line 700, thereby further simplifying the architecture of the semiconductor structure.

Figure 12:
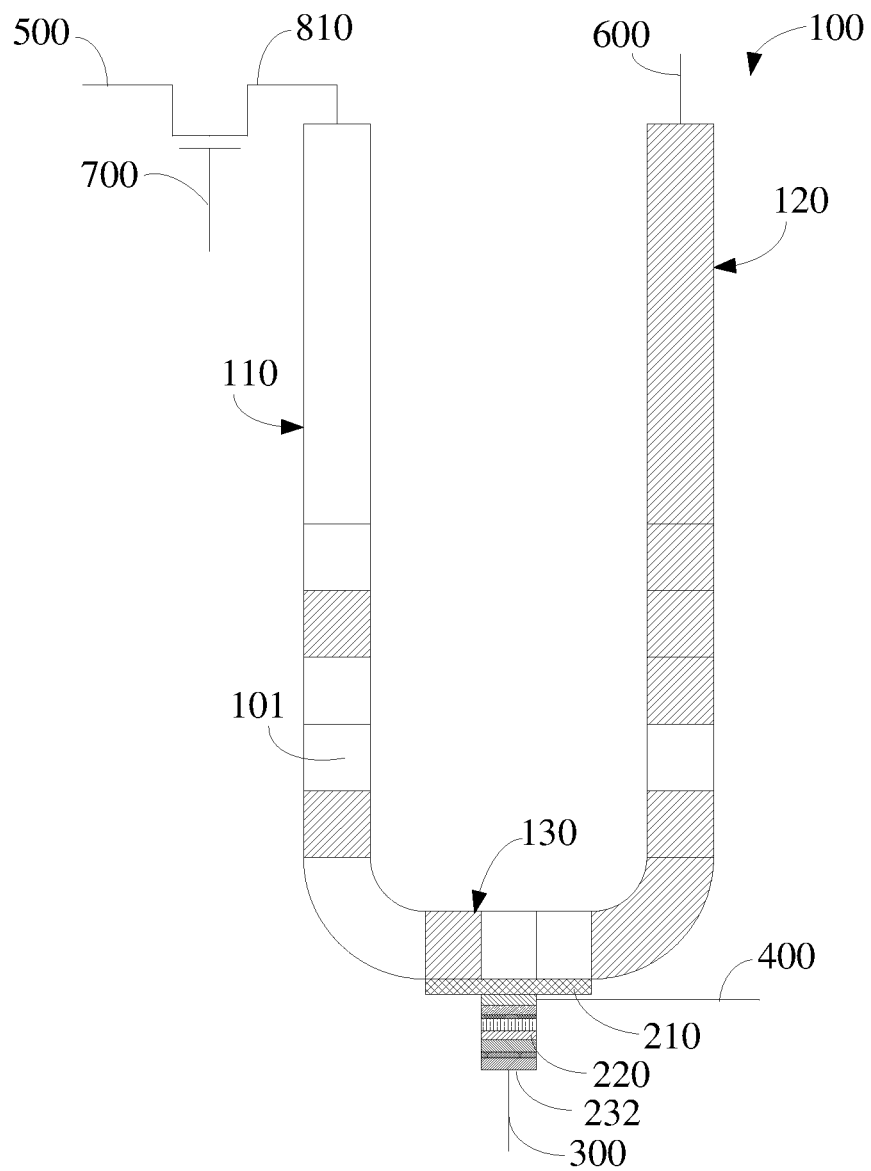
FIG. 12 is a schematic structural diagram of a semiconductor structure according to one exemplary embodiment.
Figure 13:
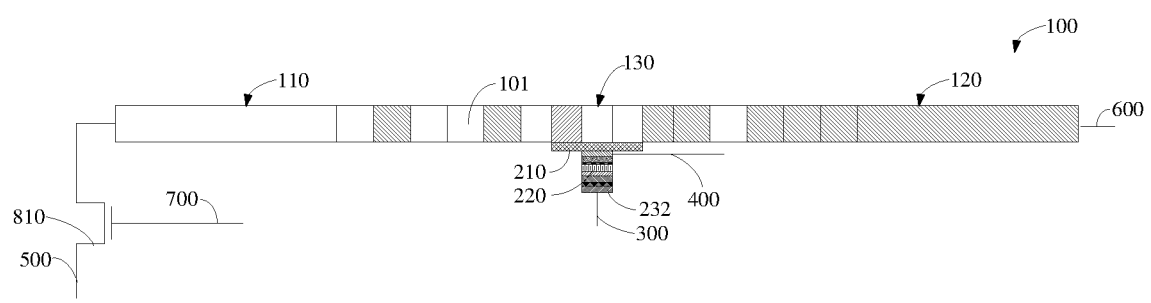
FIG. 13 is a schematic structural diagram of a semiconductor structure according to one exemplary embodiment.
Figure 14:
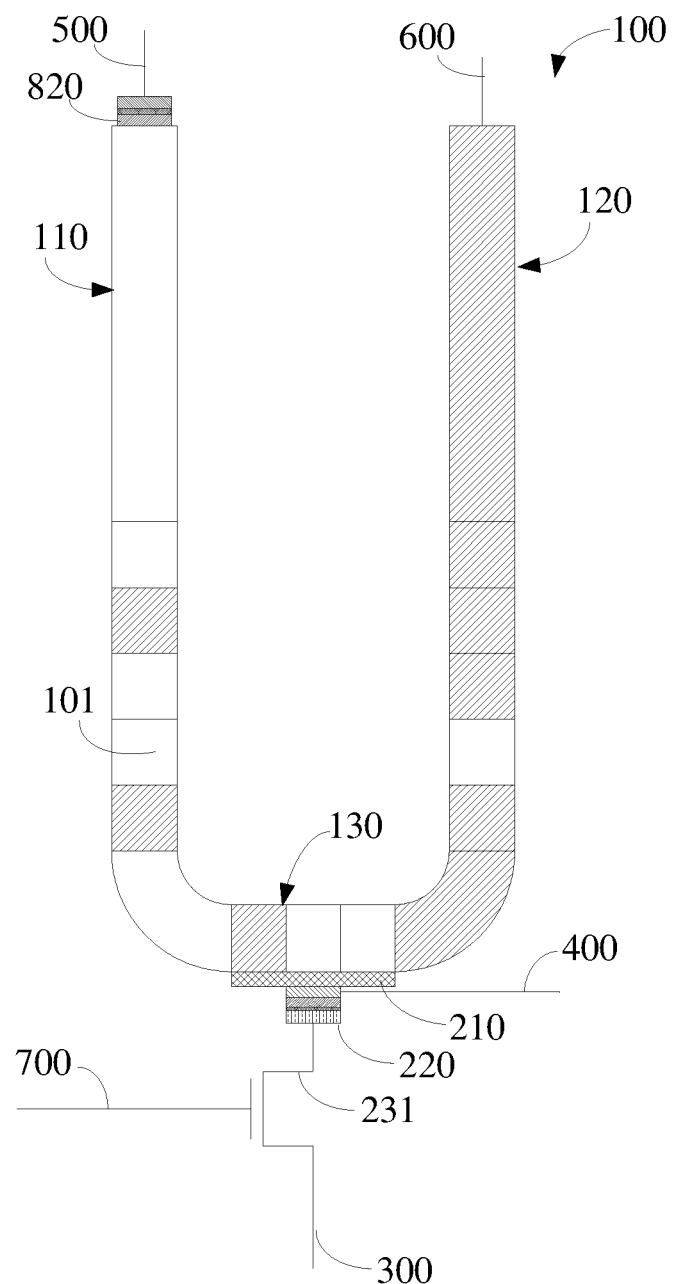
FIG. 14 is a schematic structural diagram of a semiconductor structure according to one exemplary embodiment.
Figure 15:
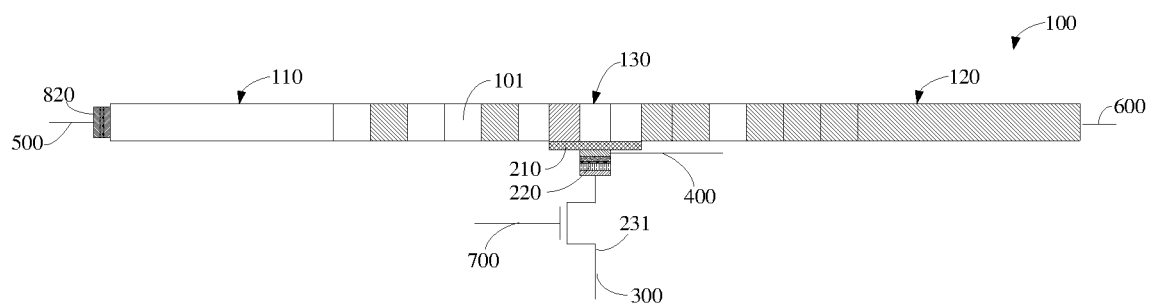
FIG. 15 is a schematic structural diagram of a semiconductor structure according to one exemplary embodiment.

The transistor of the first control circuit 230 or the second control circuit may be replaced with a HfO film selector. For example, as shown in FIG. 12 and FIG. 13, the first control circuit 230 includes a first HfO film selector 232 provided with one electrode connected to the first source line 300 and the other electrode connected to the second electrode 225 of the magnetic tunnel junction 220. The second control circuit includes a second transistor 810 provided with a source connected to the second source line 500 and a drain connected to the first end 110. A gate of the second transistor 810 is connected to the word line 700. For another example, as shown in FIG. 14 and FIG. 15, the first control circuit 230 includes a first transistor 231 provided with a source connected to the first source line 300, a drain connected to the second electrode 225 of the magnetic tunnel junction 220, and a gate connected to the word line 700. The second control circuit includes a second HfO film selector 820 provided with one electrode connected to the second source line 500 and the other electrode connected to the first end 110. The transistor is replaced with the HfO film selector, such that the semiconductor structure can be further simplified.

Figure 16:
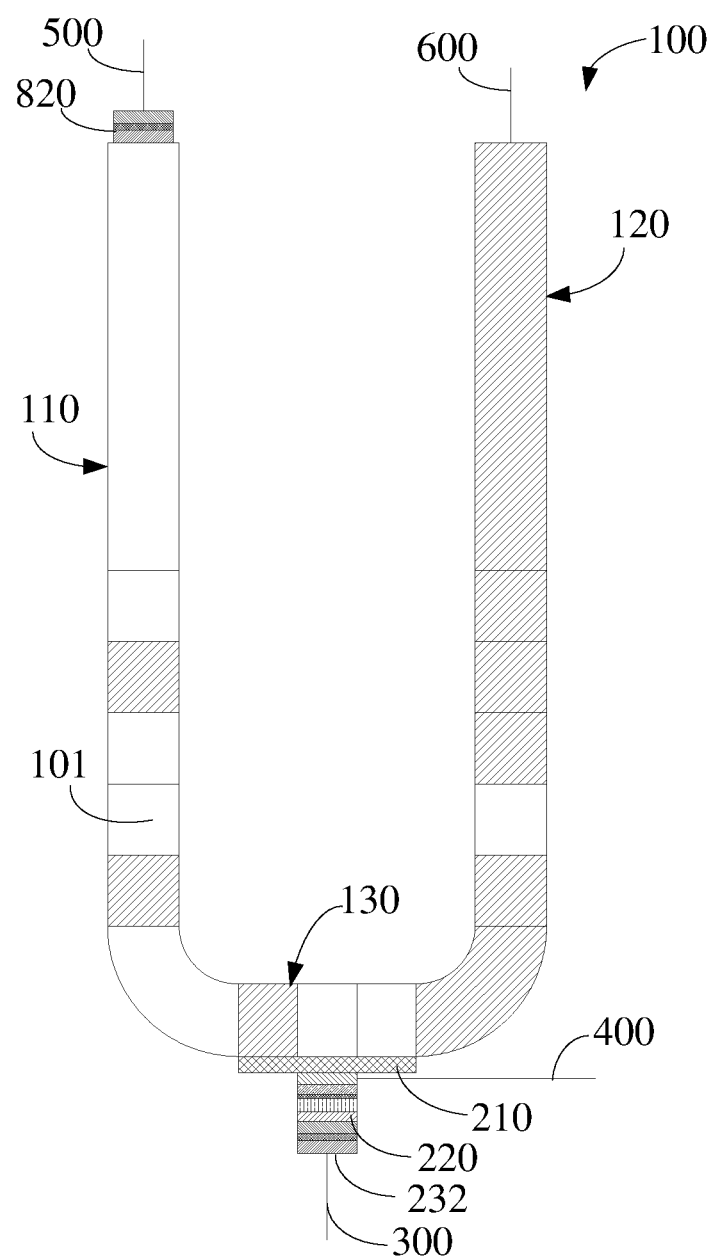
FIG. 16 is a schematic structural diagram of a semiconductor structure according to one exemplary embodiment.

In other embodiments, the first control circuit 230 and the second control circuit both employ the HfO film selector. As shown in FIG. 16 and FIG. 17, the first control circuit 230 includes a first HfO film selector 232 provided with one electrode connected to the first source line 300 and the other electrode connected to the second electrode 225 of the magnetic tunnel junction 220. The second control circuit includes a second HfO film selector 820 provided with one electrode connected to the second source line 500 and the other electrode connected to the first end 110. The transistor is replaced with the HfO film selector, such that the word line 700 is saved, thereby further simplifying the architecture of the semiconductor structure.

An exemplary embodiment of the present disclosure provides a method of reading data from the semiconductor structure. As shown in FIG. 18, the method of reading data includes:

S110. input a second read signal into the second source line and the second bit line in response to a data read command, to drive the magnetic storage domain at a target position to move to a position corresponding to the reading and writing circuit.

S120. input a first read signal into the first source line and the first bit line, to read data from the magnetic storage domain at the position corresponding to the reading and writing circuit.

In this embodiment, the second read signal is inputted into the second source line and the second bit line, such that the drive current is generated in the memory matrix to drive the movement of the magnetic storage domain; and by adjusting the magnitude of the second read signal, the number of moving bits of the magnetic storage domain can be changed, such that the data in the magnetic storage domain at the target position (i.e., the magnetic storage domain that wants to read data) can be moved to the position corresponding to the reading and writing circuit. Thereafter, the first read signal is inputted into the first source line and the first bit line, such that the data stored in the corresponding magnetic storage domain can be read.

An exemplary embodiment of the present disclosure further provides a method of writing data into the semiconductor structure. As shown in FIG. 19, the method of writing data includes:

S210. input a second write signal into the second source line and the second bit line in response to a data write command, to drive the magnetic storage domain at a target position to move to a position corresponding to the reading and writing circuit.

S220. input a first write signal into the first source line and the first bit line, to write data into the magnetic storage domain at the position corresponding to the reading and writing circuit.

In this embodiment, the second write signal is inputted into the second source line and the second bit line, such that the drive current is generated in the memory matrix to drive the movement of the magnetic storage domain; and by adjusting the magnitude of the second write signal, the number of moving bits of the magnetic storage domain can be changed, such that the data in the magnetic storage domain at the target position (i.e., the magnetic storage domain that wants to write data) can be moved to the position corresponding to the reading and writing circuit. Thereafter, the first write signal is inputted into the first source line and the first bit line, such that the data can be written into the corresponding magnetic storage domain.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A semiconductor structure, comprising:
   a memory matrix, comprising a plurality of magnetic storage domains arranged in a staggered manner and comprising a first end, a second end, and an intermediate portion relative positions of the plurality of magnet storage domains in the memory matrix being able to move within the memory matrix under action of a drive current; and a reading and writing circuit, connected to the intermediate portion of the memory matrix and configured to write data into the magnetic storage domains and read data from the magnetic storage domains.

2. The semiconductor structure according to claim 1, wherein the reading and writing circuit comprises an isolation layer, a magnetic tunnel junction, and a first control circuit.

3. The semiconductor structure according to claim 2, wherein the magnetic tunnel junction comprises a first electrode, a free layer, a tunneling barrier layer, a reference layer, and a second electrode arranged in a stacked manner, the first electrode being connected to the isolation layer.

4. A semiconductor structure, comprising:
a memory matrix, comprising a plurality of magnetic storage domains arranged in a staggered manner and comprising a first end, a second end, and an intermediate portion,
a reading and writing circuit, connected to the intermediate portion of the memory matrix and configured to write data into the magnetic storage domains and read data from the magnetic storage domains, wherein the reading and writing circuit comprises an isolation layer, a magnetic tunnel junction, and a first control circuit, and the magnetic tunnel junction comprises a first electrode, a free layer, a tunneling barrier layer, a reference layer, and a second electrode arranged in a stacked manner, the first electrode being connected to the isolation layer;
a first source line, connected to the reading and writing circuit;
a first bit line, connected to the reading and writing circuit; and
a drive device, comprising a second source line provided at the first end of the memory matrix and a second bit line provided at the second end of the memory matrix.

5. The semiconductor structure according to claim 4, wherein
the first source line is connected to the second electrode of the reading and writing circuit; and the first bit line is connected to the first electrode of the reading and writing circuit.

6. The semiconductor structure according to claim 4, wherein
a second control circuit is further provided between the first end of the memory matrix and the second source line.

7. The semiconductor structure according to claim 6, wherein the second control circuit comprises a transistor.

8. The semiconductor structure according to claim 7, wherein the first control circuit comprises a transistor.

9. The semiconductor structure according to claim 8, wherein at least one of the first control circuit or the second control circuit comprises a transistor; and the semiconductor structure further comprises a word line connected to a gate of the transistor of the at least one of the first control circuit or the second control circuit.

10. The semiconductor structure according to claim 4, wherein the isolation layer is connected to the memory matrix, and the isolation layer is connected to at least three of the magnetic storage domains.

11. The semiconductor structure according to claim 1, wherein the first end comprises a plurality of consecutive magnetic storage domains of a first direction, and the second end comprises a plurality of consecutive magnetic storage domains of a second direction, the first direction being different from the second direction.

12. The semiconductor structure according to claim 1, wherein adjacent ones of the magnetic storage domains are arranged in a staggered manner.

13. The semiconductor structure according to claim 1, wherein an overlapping region is provided between adjacent ones of the magnetic storage domains, and a maximum size of the overlapping region is 35% to 70% of a width of the magnetic storage domain.

14. A method of reading data from the semiconductor structure according to claim 4, comprising:
inputting a second read signal into a second source line and a second bit line in response to a data read command, to drive a magnetic storage domain at a target position to move to a position corresponding to a reading and writing circuit; and
inputting a first read signal into a first source line and a first bit line, to read the data from the magnetic storage domain at the position corresponding to the reading and writing circuit.

15. A method of writing data into the semiconductor structure according to claim 4, comprising:
inputting a second write signal into a second source line and a second bit line in response to a data write command, to drive a magnetic storage domain at a target position to move to a position corresponding to a reading and writing circuit; and
inputting a first write signal into a first source line and a first bit line, to write the data into the magnetic storage domain at the position corresponding to the reading and writing circuit.

16. The semiconductor structure according to claim 3, further comprising:
a first source line, connected to the reading and writing circuit;
a first bit line, connected to the reading and writing circuit; and
a drive device, comprising a second source line provided at the first end of the memory matrix and a second bit line provided at the second end of the memory matrix.

17. The semiconductor structure according to claim 16, wherein
a second control circuit is further provided between the first end of the memory matrix and the second source line.

18. The semiconductor structure according to claim 17, wherein at least one of the first control circuit or the second control circuit comprises a transistor; and the semiconductor structure further comprises a word line connected to a gate of the transistor of the at least one of the first control circuit or the second control circuit.

19. The semiconductor structure according to claim 16, wherein the isolation layer is connected to the memory matrix, and the isolation layer is connected to at least three of the magnetic storage domains.

20. The semiconductor structure according to claim 4, wherein an overlapping region is provided between adjacent ones of the magnetic storage domains, and a maximum size of the overlapping region is 35% to 70% of a width of the magnetic storage domain.

* * * * *